United States Patent
Furuhata et al.

(10) Patent No.: US 9,067,777 B2
(45) Date of Patent: Jun. 30, 2015

(54) MEMS DEVICE, ELECTRONIC MODULE, ELECTRONIC APPARATUS, AND MOBILE UNIT

(71) Applicant: Seiko Epson Corporation, Tokyo (JP)

(72) Inventors: Makoto Furuhata, Matsumoto (JP); Satoru Tanaka, Chino (JP)

(73) Assignee: Seiko Epson Corporation (JP)

( * ) Notice: Subject to any disclaimer, the term of this patent is extended or adjusted under 35 U.S.C. 154(b) by 52 days.

(21) Appl. No.: 13/941,892

(22) Filed: Jul. 15, 2013

(65) Prior Publication Data

US 2014/0021562 A1    Jan. 23, 2014

(30) Foreign Application Priority Data

Jul. 23, 2012   (JP) ................................. 2012-162382

(51) Int. Cl.
| | |
|---|---|
| *H01L 29/84* | (2006.01) |
| *B81B 3/00* | (2006.01) |
| *B81B 7/00* | (2006.01) |

(52) U.S. Cl.
CPC ............. *B81B 3/0018* (2013.01); *B81B 7/0006* (2013.01); *B81B 2207/012* (2013.01); *B81B 3/0086* (2013.01)

(58) Field of Classification Search
CPC ..................... B81B 2207/092; B81B 2207/07; B81B 2207/097; B81B 2203/0323; B81B 2203/033
USPC ................................................. 257/414–417
See application file for complete search history.

(56) References Cited

U.S. PATENT DOCUMENTS

| | | | |
|---|---|---|---|
| 5,627,317 A | 5/1997 | Offenberg et al. | |
| 5,719,073 A | 2/1998 | Shaw et al. | |
| 6,121,552 A * | 9/2000 | Brosnihan et al. ............. | 174/253 |
| 6,170,332 B1 | 1/2001 | MacDonald et al. | |
| 6,171,881 B1 | 1/2001 | Fujii | |
| 6,388,300 B1 | 5/2002 | Kano et al. | |
| 6,494,096 B2 | 12/2002 | Sakai et al. | |
| 7,088,559 B2 * | 8/2006 | Hipwell et al. ............. | 360/294.3 |
| 2011/0217841 A1 * | 9/2011 | Chen et al. ..................... | 438/667 |

FOREIGN PATENT DOCUMENTS

| | | |
|---|---|---|
| JP | 05-304303 | 11/1993 |
| JP | 8-506857 | 7/1996 |
| JP | 7-333078 | 12/1998 |
| JP | 2000-286430 A | 10/2000 |
| WO | WO-94-18697 | 8/1994 |

OTHER PUBLICATIONS

Denso Technical Review, vol. 5 No. 1 2000 pp. 39-44.

* cited by examiner

*Primary Examiner* — Cuong Q Nguyen
*Assistant Examiner* — Nishath Yasmeen
(74) *Attorney, Agent, or Firm* — Harness, Dickey & Pierce, P.L.C.

(57) ABSTRACT

A MEMS device includes: a base substrate; a first wiring disposed on the base substrate using a first structure; a second wiring disposed on the base substrate using the first structure and a second structure connected to the first structure; and a MEMS element connected with the first wiring and the second wiring and arranged on the base substrate, wherein the first wiring and the second wiring include a crossing portion where the first wiring and the second wiring cross each other, and at the crossing portion, the first structure of the first wiring and the second structure of the second wiring cross each other.

14 Claims, 10 Drawing Sheets

MEMS DEVICE, ELECTRONIC MODULE, ELECTRONIC APPARATUS, AND MOBILE UNIT

BACKGROUND

1. Technical Field

The present invention relates to a MEMS device, an electronic module, an electronic apparatus, and a mobile unit.

2. Related Art

Heretofore, MEMS devices that detect angular velocity or the like have been known in which a MEMS element is formed on a base substrate and a wiring to be connected to the MEMS element is formed on the base substrate using a MEMS (Micro Electro Mechanical System) technique.

As a method of manufacturing such MEMS devices, for example, a silicon substrate serving as the material of a semiconductor element is bonded by anodic bonding to a base substrate formed of glass or the like. Then, the silicon substrate is etched, while leaving a region of the silicon substrate where a MEMS element as a constituent of the MEMS device is formed and a region of the silicon substrate where a wiring to be connected to the MEMS element is formed, to mold the MEMS element and the wiring, whereby the MEMS device is obtained.

For example, in DENSO TECHNICAL REVIEW, Vol. 5, No. 1, 2000, pp. 39-44 (Non-Patent Document 1), an SOI (Silicon on Insulator) substrate is used as a base substrate. Then, Non-Patent Document 1 discloses a configuration in which in a MEMS device having a MEMS element arranged on the SOI substrate, a wiring using polysilicon as a material for connecting with the MEMS element is embedded in the SOI substrate and the wiring is connected with the MEMS element as a destination. In the SOI substrate in Non-Patent Document 1, a $SiO_2$ layer is provided below the position where the wiring is embedded.

However, the wiring is arranged close to the $SiO_2$ glass substrate or the $SiO_2$ layer. Since $SiO_2$ has a high relative dielectric constant, when the wiring is arranged close to $SiO_2$, a parasitic capacitance (stray capacitance) is likely to occur between wirings. Therefore, either method has a risk that electrical characteristics of the MEMS element are adversely affected by the parasitic capacitance between wirings.

SUMMARY

An advantage of some aspects of the invention is to solve at least a part of the problems described above, and the invention can be implemented as the following forms or application examples.

Application Example 1

A MEMS device according to this application example includes: abase substrate; a first wiring disposed on the base substrate using a first structure; a second wiring disposed on the base substrate using the first structure and a second structure connected to the first structure; and a MEMS element connected with the first wiring and the second wiring and arranged on the base substrate, wherein the first wiring and the second wiring include a crossing portion where the first wiring and the second wiring cross each other, and at the crossing portion, the first structure of the first wiring and the second structure of the second wiring cross each other.

According to the MEMS device, the first wiring connected to the MEMS element has the first structure, the second wiring has the first structure and the second structure, and the first wiring and the second wiring are disposed on the base substrate. Moreover, the crossing portion where the first wiring and the second wiring cross each other is included, and the first structure and the second structure cross each other at the crossing portion.

Due to this, the first wiring and the second wiring that are disposed on the base substrate can be installed while crossing each other, so that an area of the base substrate required for wiring can be suppressed and thus a reduction in the size of the MEMS device can be realized.

Application Example 2

In the MEMS device according to the application example described above, it is preferable that a groove portion is disposed on the base substrate, and that the first structure is disposed in the groove portion.

According to this MEMS device, the first structure is disposed in the groove portion disposed on the base substrate, and the second structure is disposed on the base substrate.

Due to this, the second structure disposed on the base substrate can straddle the first structure disposed in the groove portion and cross the first structure without contact.

Therefore, the first wiring and the second wiring can cross each other with a void therebetween, so that a parasitic capacitance generated by the crossing of the first structure and the second structure can be suppressed and thus the MEMS device in which electrical characteristics of the MEMS element have a little effect for parasitic capacity.

Application Example 3

In the MEMS device according to the application example described above, it is preferable that the groove portion at the crossing portion is deeper than the groove portion at the other portions.

According to this MEMS device, the first structure is disposed in the groove portion whose groove depth is made deep at the crossing portion where the first wiring and the second wiring cross each other.

Due to this, a spaced apart distance between the first structure and the second structure at the portion where they cross each other can be increased, so that a parasitic capacitance generated between the first structure and the second structure can be suppressed and thus the MEMS device in which electrical characteristics of the MEMS element have a little effect for parasitic capacity.

Application Example 4

In the MEMS device according to the application example described above, it is preferable that the width of the second structure at the crossing portion is narrower than that of the second structure at the other portions.

According to this MEMS device, the width of the second structure that straddles the first structure at the crossing portion where the first wiring and the second wiring cross each other is narrowed compared to the second structure disposed at the other portions. Due to this, when the base substrate on which the first structure and the second structure are disposed is viewed planarly from above, an area of a crossing portion of the first structure and the second structure, that is, an overlapping area of them is reduced, whereby a parasitic capacitance generated between the structures can be suppressed. Therefore, the MEMS device in which electrical characteristics of the MEMS element have a little effect for parasitic capacity.

Application Example 5

In the MEMS device according to the application example described above, it is preferable that the first structure includes metal, and that the second structure includes silicon.

According to this MEMS device, a metal-containing film as the first structure can be disposed in the groove portion using a sputtering method or the like. Due to this, a metal film that can provide electrical continuity can be simply disposed as the first structure in the groove portion. The second structure can be formed to include silicon by a dry etching method or the like. Due to this, the second wiring that straddles the groove portion in which the first structure is disposed can be disposed. Moreover, the second structure having a different width at the crossing portion can be easily formed simultaneously with the MEMS element formed of silicon.

Application Example 6

An electronic module according to this application Example includes the MEMS device described above mounted thereon.

According to the electronic module, since the MEMS device described above is mounted, an adverse effect on electrical characteristics due to the parasitic capacitance between the wirings is suppressed and thus the electronic module in which detection accuracy for angular velocity or the like is enhanced can be obtained.

Application Example 7

An electronic apparatus according to this application example includes the MEMS device described above mounted thereon.

According to the electronic apparatus, since the MEMS device described above is mounted, an adverse effect on electrical characteristics due to the parasitic capacitance is suppressed and thus the electronic apparatus in which detection accuracy for angular velocity or the like is enhanced can be obtained.

Application Example 8

A mobile unit according to this application example includes the MEMS device described above mounted thereon.

According to the mobile unit, since the MEMS device described above is mounted, an adverse effect on electrical characteristics due to the parasitic capacitance is suppressed and thus the mobile unit in which detection accuracy for angular velocity or the like is enhanced can be obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
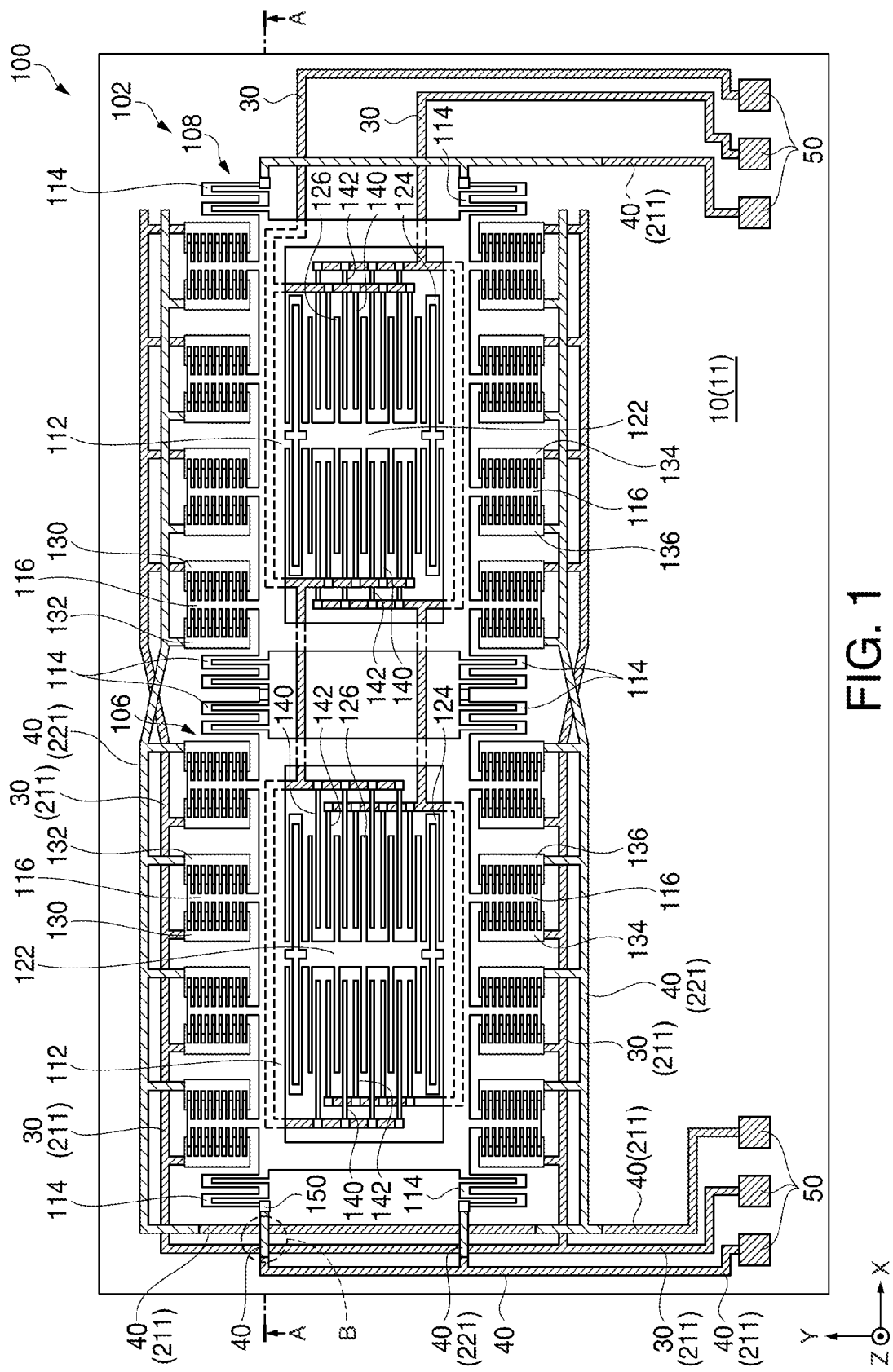
FIG. 1 is a plan view schematically showing a schematic configuration of a MEMS device according to a first embodiment.

Hereinafter, embodiments of the invention will be described based on the drawings. In the drawings shown below, the dimensions and ratios of constituents are appropriately made different from actual ones in order to make the constituents recognizable in the drawings. Moreover, an XYZ orthogonal coordinate system is set, and a positional relation between parts will be described with reference to the XYZ orthogonal coordinate system. A predetermined direction in the vertical plane is defined as an X-axis direction; a direction orthogonal to the X-axis direction in the vertical plane is defined as a Y-axis direction; and a direction orthogonal to the X-axis direction and the Y-axis direction is defined as a Z-axis direction. With the direction of gravitational force as a reference, the direction of gravitational force is defined as a downward direction or negative direction, while the opposite direction is defined as an upward direction or positive direction.

First Embodiment

FIGS. 1 to 8 show a MEMS device according to a first embodiment.

Figure 2:
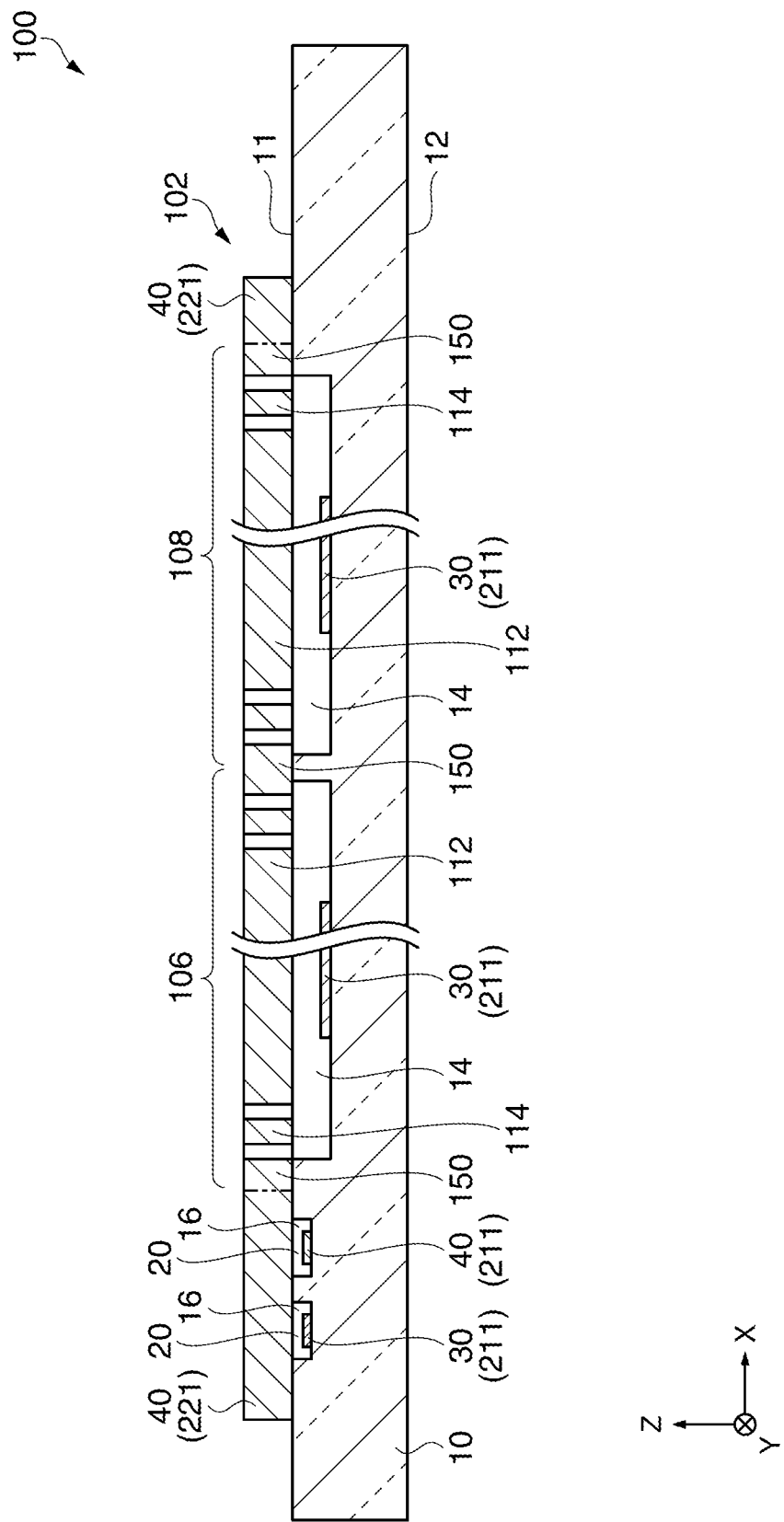
FIG. 2 is a cross-sectional view schematically showing the schematic configuration of the MEMS device according to the first embodiment.

FIG. 1 is a plan view showing a schematic configuration of the MEMS device as viewed planarly from the Z-axis direction. FIG. 2 is a schematic view showing a cross section of the MEMS device shown in FIG. 1, taken along line A-A. FIGS. 3A to 3C and 4 are enlarged views showing in an enlarged manner wirings of the MEMS device shown in FIG. 1. FIGS. 5 to 8 explain operation of the MEMS device.

As an exemplary form, the MEMS device 100 of the embodiment described below is configured as a gyro sensor that detects angular velocity or the like.

Structure of MEMS Device

As shown in FIGS. 1 and 2, the MEMS device 100 includes a base substrate 10, a MEMS element 102, first wirings 30, and second wirings 40.

For example, glass is used as the material of the base substrate 10. As shown in FIG. 2, the base substrate 10 has a first surface 11 and a second surface 12 on the side opposite to the first surface 11.

Recesses 14 are disposed in the first surface 11 of the base substrate 10. Above each of the recesses 14, a vibrating body 112 of the MEMS element 102 is disposed with a gap. Due to the recess 14, the vibrating body 112 can vibrate (move) in a desired direction without interfering with the base substrate

10. Moreover, the base substrate 10 has groove portions 16 in each of which a first structure 211 (described later) is disposed. For convenience sake in FIG. 1, the illustration of the recess 14 and the groove portion 16 is omitted.

The MEMS element 102 is disposed on the base substrate 10 (on the first surface 11 of the base substrate 10). In the following, an example will be described in which the MEMS element 102 is a gyro sensor element (electrostatic capacitive MEMS gyro sensor element) that detects angular velocity about the Z-axis.

As shown in FIGS. 1 and 2, the MEMS element 102 includes a first MEMS element (structure) 106 and a second MEMS element (structure) 108. The first MEMS element 106 and the second MEMS element 108 are coupled to each other along the X-axis. The first MEMS element 106 is located on the negative X-axis direction side of the second MEMS element 108.

As shown in FIGS. 1 and 2, each of the first MEMS element 106 and the second MEMS element 108 includes the vibrating body 112, first spring portions 114, movable driving electrodes 116, a displacement portion 122, second spring portions 124, movable detecting electrodes 126, first fixed driving electrodes 130 and 132, second fixed driving electrodes 134 and 136, fixed detecting electrodes 140 and 142, and fixed portions 150.

The first wiring 30 shown in FIG. 1 has the first structure 211. The first wiring 30 is connected to the first fixed driving electrodes 130 and the fixed detecting electrodes 142, both constituting the MEMS element 102. Moreover, the first wiring 30 is connected with an electrode pad 50 at the other end not connected with the MEMS element 102, and a wiring (not shown) is connected to the electrode pad 50, whereby signals obtained by the first fixed driving electrode 130 and the fixed detecting electrode 142 can be output to the outside of the MEMS device 100.

The second wiring 40 shown in FIG. 1 has the first structure 211 and a second structure 221. In the second wiring 40, the first structure 211 and the second structure 221 are connected at a connecting portion 320 (refer to FIG. 4). The second wiring 40 is connected to the first spring portions 114, the second fixed driving electrodes 136, and the first fixed driving electrodes 132, all constituting the MEMS element 102. Moreover, the second wiring 40 is connected with an electrode pad 50 at the other end not connected with the MEMS element 102, and a wiring (not shown) is connected to the electrode pad 50, whereby driving signals or the like can be applied to the first spring portions 114, the first fixed driving electrodes 132, and the second fixed driving electrodes 136 from the outside of the MEMS device 100.

For the first structure 211 included in the first wiring 30 and the second wiring 40, for example, a conductive film formed by a sputtering method using metal, such as ITO (Indium Tin Oxide), silver (Ag), or aluminum (Al), as a material can be used.

For the second structure 221 included in the second wiring 40, for example, a structure formed of silicon or the like and having conductivity can be used. The second structure 221 is formed integrally with the vibrating body 112, the first spring portion 114, the second spring portion 124, the movable driving electrode 116, the displacement portion 122, the movable detecting electrode 126, and the fixed portion 150 of the MEMS element 102 by processing a silicon substrate (not shown) bonded to the base substrate 10. Due to this, a fine processing technique used in the manufacture of silicon semiconductor devices can be used.

The MEMS device 100 of the embodiment has crossing portions 300 (the reference numeral and detailed illustration are omitted in FIG. 1) at each of which the first wiring 30 and the second wiring 40 that are connected to the MEMS element 102 cross each other.

Figure 3A:
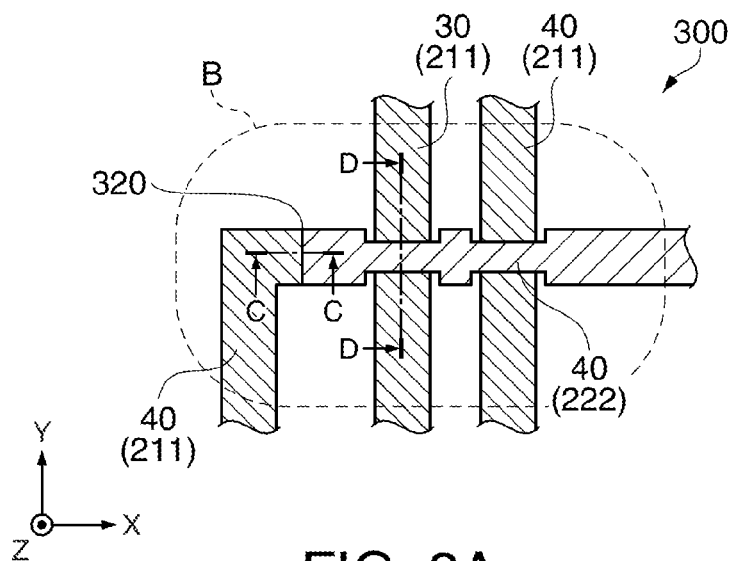
FIGS. 3A to 3C are enlarged views schematically showing in an enlarged manner wirings of the MEMS device according to the first embodiment.
Figure 3B:
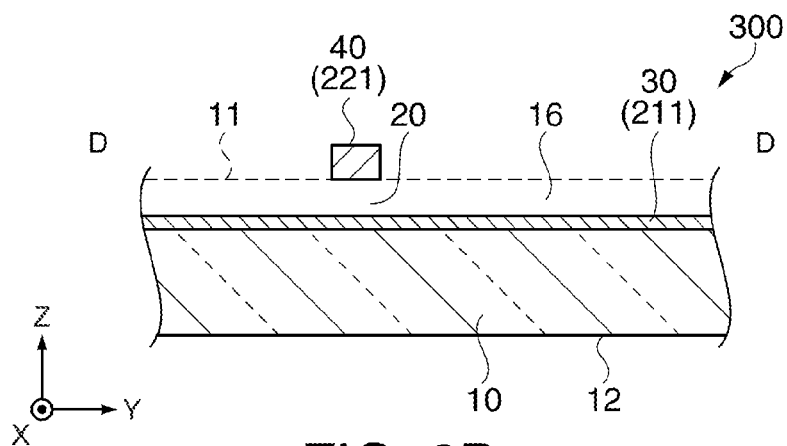
Figure 3C:
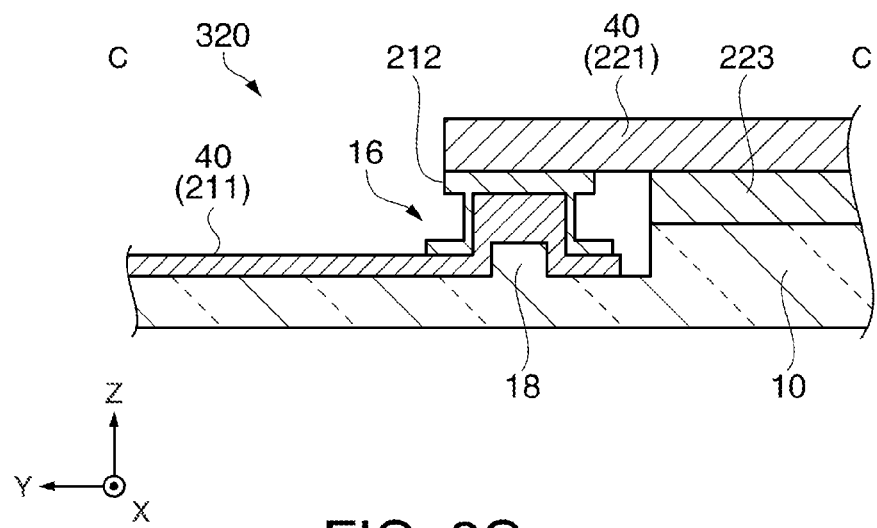

FIG. 3A shows in an enlarged manner the crossing portion 300 indicated by the reference sign B and surrounded by the broken line in FIG. 1. FIG. 3B shows the crossing portion 300 as viewed cross-sectionally from the X-axis direction indicated by line D-D of the crossing portion 300 shown in FIG. 3A. FIG. 3C shows a cross section of the connecting portion 320 as viewed cross-sectionally from the Y-axis direction indicated by line C-C in FIG. 3A.

At the crossing portion 300 shown in FIGS. 2, 3A, and 3B, the first wiring 30 and the second wiring 40 cross each other with different structures, that is, the first structure 211 and the second structure 221.

In the MEMS device 100 of the embodiment, the first structure 211 included in the first wiring 30 and the second wiring 40 is disposed in the groove portion 16 disposed in the first surface 11 of the base substrate 10. The second structure 221 included in the second wiring 40 is disposed on the first surface 11 of the base substrate 10.

Due to this, at the crossing portion 300, a structure is provided in which the second structure 221 disposed on the first surface 11 of the base substrate 10 straddles the first structure 211 disposed in the groove portion 16 and crosses the first structure 211 with a void 20 therebetween.

In the MEMS device 100, the first wiring 30 is connected with the MEMS element 102 through the first structure 211 disposed in the groove portion 16. The second wiring 40 has, in a path connected to the MEMS element 102, the connecting portion 320 (the reference numeral and detailed illustration are omitted in FIG. 1) where the first structure 211 and the second structure 221 are connected.

The connecting portion 320 shown in FIG. 3C is a portion that electrically connects the first structure 211 and the second structure 221, both included in the second wiring 40.

At the connecting portion 320, the first structure 211 is disposed so as to cover a convex portion 18 of the base substrate 10 disposed in the groove portion 16. At the portion where the convex portion 18 is covered with the first structure 211, a bump portion 212 is further disposed. The bump portion 212 is configured of, for example, a metal film including chromium (Cr) and gold (Au), or a metal film including platinum (Pt) and titanium (Ti).

The second structure 221 connected with the first structure 211 at the connecting portion 320 is disposed so as to overlap with the convex portion 18, and connected (bonded) to the bump portion 212.

A film 223 is disposed between the second structure 221 and the first surface 11 of the base substrate 10. The film 223 serves to adjust a gap between the second structure 221 and the base substrate 10. If the film 223 is not present, electrical continuity is not established due to a contact failure with the second structure 221 when the height of the bump portion 212 is low, while the second structure 221 may be peeled off from the base substrate 10 when the height of the bump portion 212 is high. In the embodiment, for example, a silicon oxide film ($SiO_2$) is used for the film 223. The illustration of the film 223 is omitted except in FIG. 3C.

When the base substrate 10 is viewed planarly from the Z-axis direction as shown in FIG. 3A, the second structure 221 has an overpass portion 222 where the width is narrowed. The overpass portion 222 is disposed so as to straddle the first structure 211 at the crossing portion 300. Due to this, an overlapping area of the second structure 221 (the overpass portion 222) and the first structure 211 can be reduced. Therefore, because of the overlapping of the first structure 211 and the second structure 221 at the crossing portion 300, a parasitic capacitance (stray capacitance) generated between the first wiring 30 and the second wiring 40 can be suppressed. In FIG. 1, the reference numeral of the crossing portion 300 is omitted, and in addition, the illustration of the overpass portion 222 is omitted.

Figure 4:
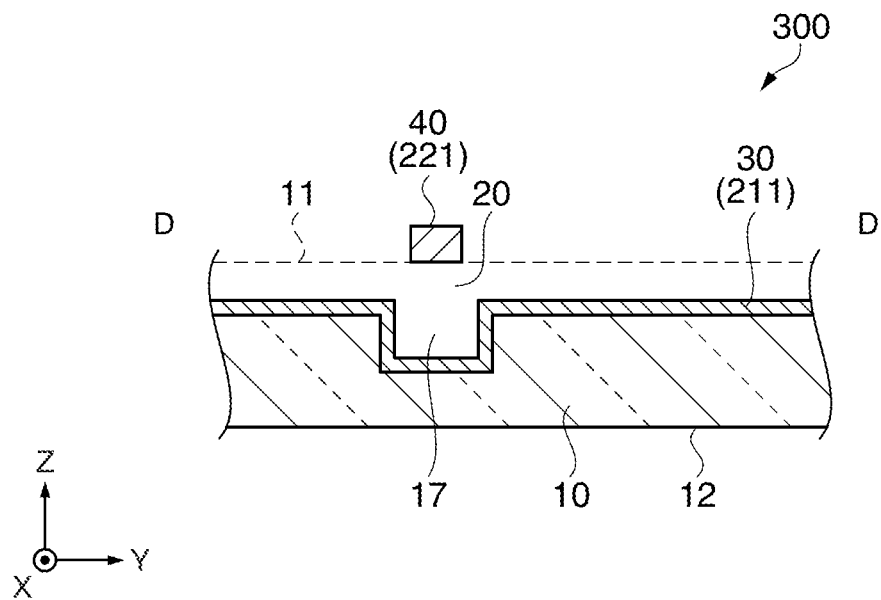
FIG. 4 is an enlarged view schematically showing in an enlarged manner wirings of the MEMS device according to the first embodiment.

At the crossing portion 300 as shown in FIG. 4, a recess 17 may be disposed in the groove portion 16 in which the first structure 211 is disposed. By disposing the recess 17, a spaced apart distance between the first structure 211 and the second structure 221 (the overpass portion 222), which cross each other with the void 20 at the crossing portion 300, can be increased, so that the parasitic capacitance (stray capacitance) generated between the wirings can be suppressed.

In the MEMS device 100 of the embodiment, the vibrating body 112, the first spring portion 114, the second spring portion 124, the movable driving electrode 116, the displacement portion 122, the movable detecting electrode 126, the fixed portion 150, and the second structure 221 can be integrally formed by, for example, processing a silicon substrate (not shown) bonded to the base substrate 10. Due to this, a fine processing technique used in the manufacture of silicon semiconductor devices is applicable, the first wiring 30 and the second wiring 40 can cross each other with a simple structure, and thus a reduction in the size of the MEMS device 100 can be achieved.

Operation of MEMS Device

Next, operation of the MEMS device 100 as a gyro sensor will be described. FIGS. 5 to 8 explain the operation of the MEMS device 100. In FIGS. 5 to 8, the X-axis, the Y-axis, and the Z-axis are shown as three axes orthogonal to one another. For convenience sake in FIGS. 5 to 8, the illustration of the constituent members other than the MEMS element 102 is omitted. Moreover, the illustration of the movable driving electrode 116, the movable detecting electrode 126, the first fixed driving electrodes 130 and 132, the second fixed driving electrodes 134 and 136, and the fixed detecting electrodes 140 and 142 is omitted to illustrate the MEMS element 102 in a simplified manner.

Figure 5:
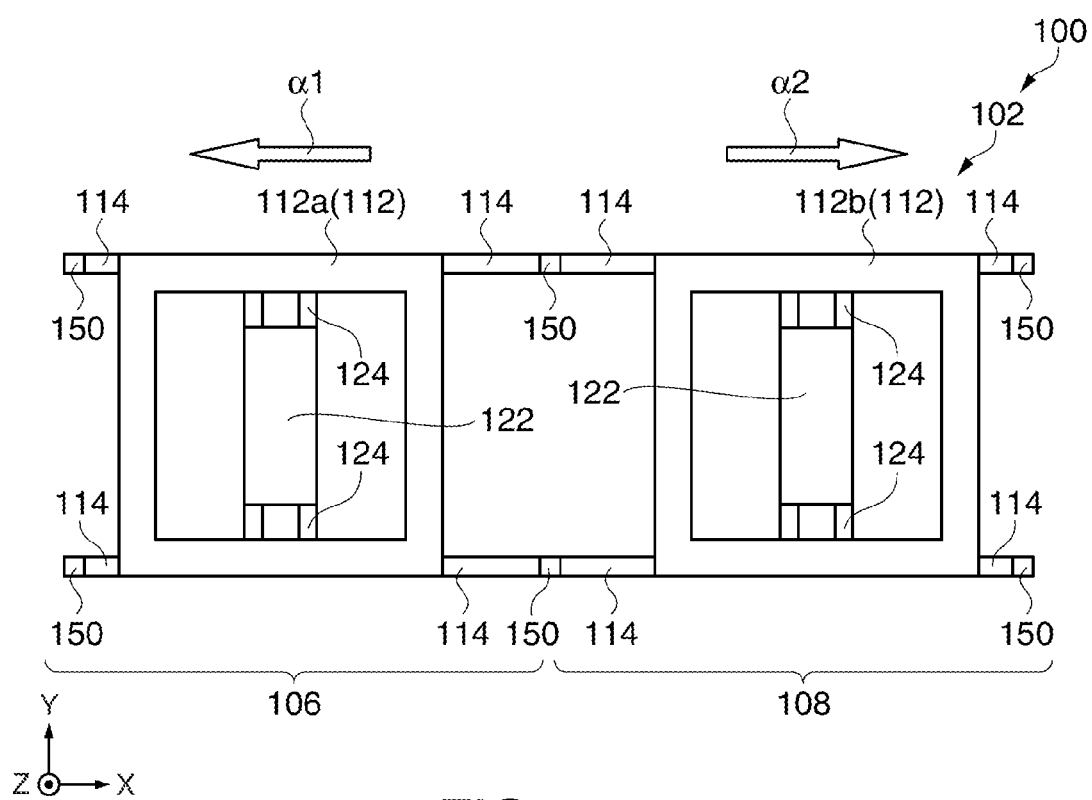
FIG. 5 explains operation of the MEMS device according to the first embodiment.
Figure 6:
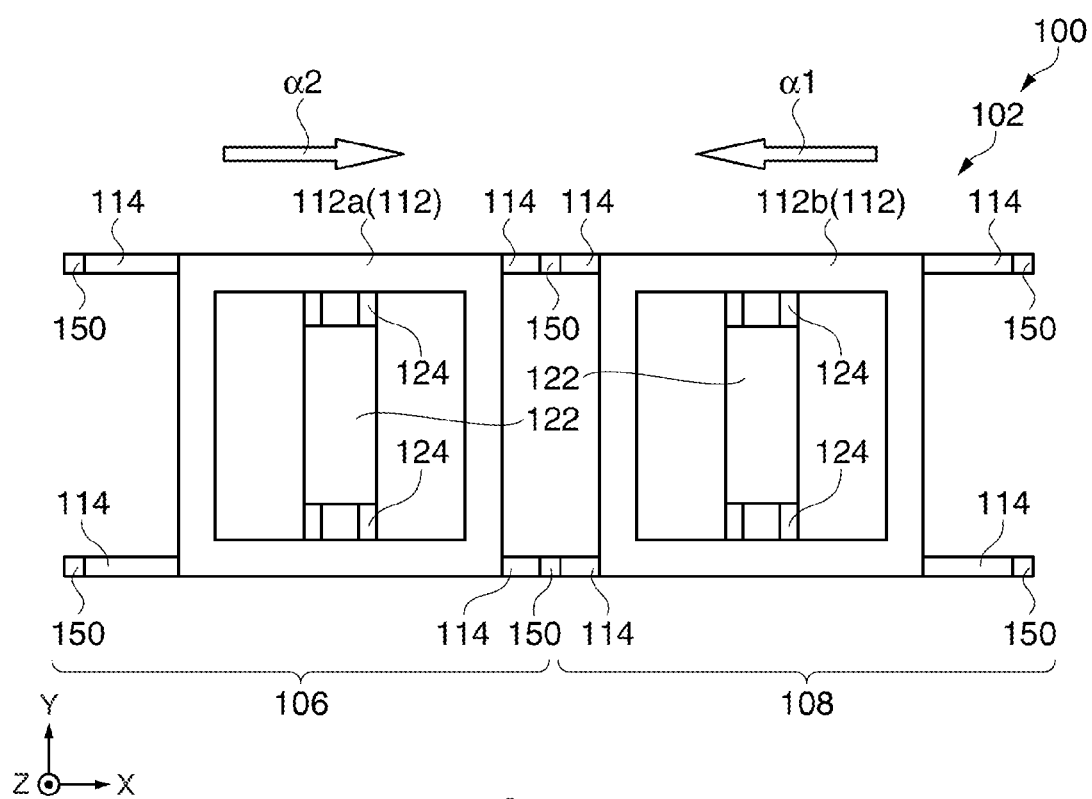
FIG. 6 explains operation of the MEMS device according to the first embodiment.

When a voltage is applied, by a power supply (not shown), between the movable driving electrode (first movable driving electrode) 116 (not shown in FIGS. 5 to 8) extending from the vibrating body 112 in the positive Y-axis direction and the first fixed driving electrodes 130 and 132 (not shown in FIGS. 5 to 8), and between the movable driving electrode (second movable driving electrode) 116 (not shown in FIGS. 5 to 8) extending from the vibrating body 112 in the negative Y-axis direction and the second fixed driving electrodes 134 and 136 (not shown in FIGS. 5 to 8), an electrostatic force can be generated between the movable driving electrode 116 and the fixed driving electrodes 130 and 132, and between the second movable driving electrode 116 and the second fixed driving electrodes 134 and 136. Due to this, as shown in FIGS. 5 and 6, the first spring portion 114 can be expanded and contracted along the X-axis, so that the vibrating body 112 can be vibrated along the X-axis.

More specifically, a constant potential (Vr) is given to the movable driving electrode 116 via the second wiring 40 serving as a fixed potential wiring. Further, a first AC voltage using the constant potential (Vr) as a reference is applied to the fixed driving electrodes 130 and 134 via the first wiring 30 (the first structure 211). Moreover, a second AC voltage whose phase is shifted by 180 degrees from the first AC voltage using the constant potential Vr as a reference is applied to the fixed driving electrodes 132 and 136 via the second wiring 40 (the first structure 211).

In the first fixed driving electrodes 130 and 132 interposing the first movable driving electrode 116 therebetween, in the first MEMS element 106, the first fixed driving electrode 130 is disposed on the negative X-axis direction side of the first movable driving electrode 116, while the first fixed driving electrode 132 is disposed on the positive X-axis direction side of the first movable driving electrode 116 (refer to FIG. 1). In the second MEMS element 108, the first fixed driving electrode 130 is disposed on the positive X-axis direction side of the first movable driving electrode 116, while the first fixed driving electrode 132 is disposed on the negative X-axis direction side of the first movable driving electrode 116 (FIG. 1). In the second fixed driving electrodes 134 and 136 interposing the second movable driving electrode 116 therebetween, in the first MEMS element 106, the second fixed driving electrode 134 is disposed on the negative X-axis direction side of the second movable driving electrode 116, while the second fixed driving electrode 136 is disposed on the positive X-axis direction side of the second movable driving electrode 116 (refer to FIG. 1). In the second MEMS element 108, the second fixed driving electrode 134 is disposed on the positive X-axis direction side of the second movable driving electrode 116, while the second fixed driving electrode 136 is disposed on the negative X-axis direction side of the second movable driving electrode 116 (refer to FIG. 1). Therefore, with the first AC voltage and the second AC voltage, a vibrating body 112a of the first MEMS element 106 and a vibrating body 112b of the second MEMS element 108 can be vibrated in phase opposition at a predetermined frequency along the X-axis. In the example shown in FIG. 5, the vibrating body 112a is displaced in an α1 direction, while the vibrating body 112b is displaced in an α2 direction opposite to the α1 direction. In the example shown in FIG. 6, the vibrating body 112a is displaced in the α2 direction, while the vibrating body 112b is displaced in the α1 direction.

The displacement portion 122 is displaced along the X-axis with the vibration of the vibrating body 112 (112a and 112b). Similarly, the movable detecting electrode 126 (refer to FIG. 1) is displaced along the X-axis with the vibration of the vibrating body 112.

Figure 7:
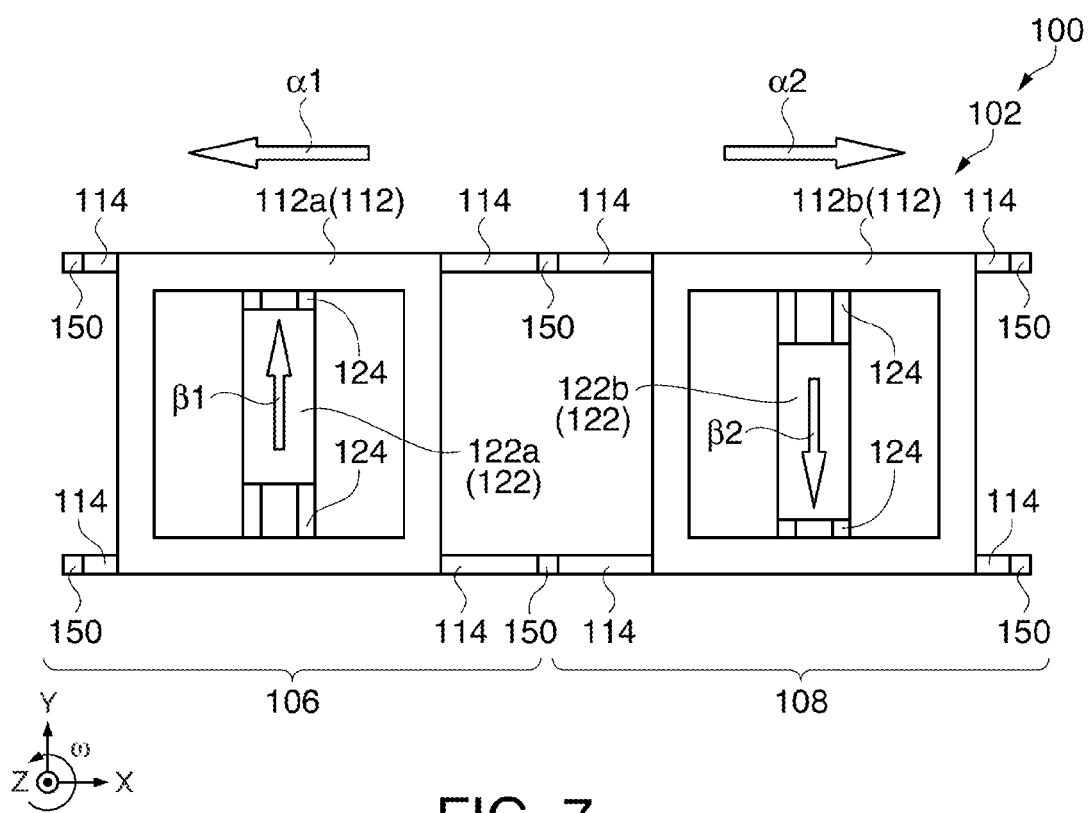
FIG. 7 explains operation of the MEMS device according to the first embodiment.
Figure 8:
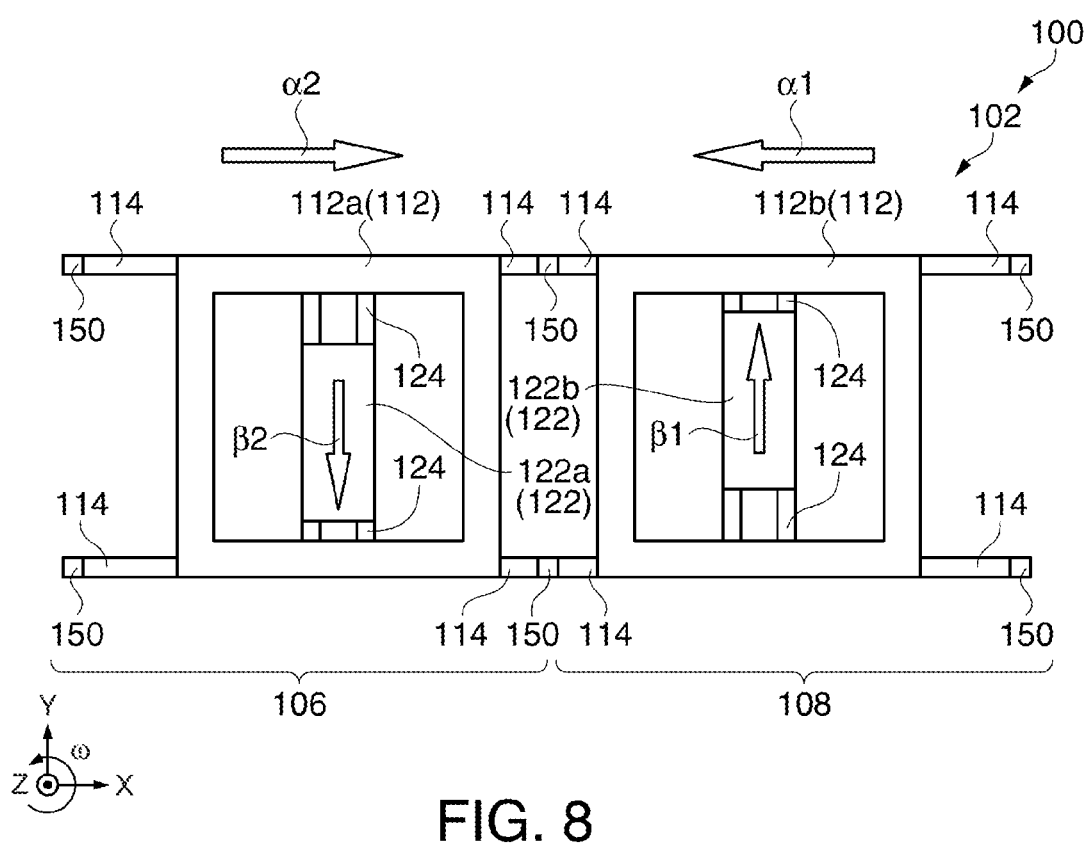
FIG. 8 explains operation of the MEMS device according to the first embodiment.

As shown in FIGS. 7 and 8, when angular velocity ω about the Z-axis is applied to the MEMS element 102 in a state where the vibrating bodies 112a and 112b vibrate along the X-axis, the Coriolis force acts and thus the displacement portion 122 is displaced along the Y-axis. That is, a displacement portion 122a connected to the vibrating body 112a and a displacement portion 122b connected to the vibrating body 112b are displaced in opposite directions along the Y-axis. In the example shown in FIG. 7, the displacement portion 122a is displaced in a β1 direction, while the displacement portion 122b is displaced in a β2 direction opposite to the β1 direction. In the example shown in FIG. 8, the displacement portion 122a is displaced in the β2 direction, while the displacement portion 122b is displaced in the β1 direction.

The displacement portion 122 (122a and 122b) is displaced along the Y-axis, whereby a distance between the movable detecting electrode 126 and the fixed detecting electrode 140 is changed (refer to FIG. 1). Similarly, a distance between the movable detecting electrode 126 and the fixed detecting electrode 142 is changed (refer to FIG. 1). Therefore, an electrostatic capacitance between the movable detecting electrode 126 and the fixed detecting electrode 140 is changed. Similarly, an electrostatic capacitance between the movable detecting electrode 126 and the fixed detecting electrode 142 is changed.

In the MEMS device 100 as a gyro sensor, a voltage is applied between the movable detecting electrode 126 and the fixed detecting electrode 140 via the first wiring 30 serving as a detecting wiring and the second wiring 40 serving as a fixed potential wiring, whereby the amount of change in the electrostatic capacitance between the movable detecting electrode 126 and the fixed detecting electrode 140 can be detected (refer to FIG. 1). Further, a voltage is applied between the movable detecting electrode 126 and the fixed detecting electrode 142 via the first wiring 30 serving as a detecting wiring and the second wiring 40 serving as a fixed potential wiring, whereby the amount of change in the electrostatic capacitance between the movable detecting electrode 126 and the fixed detecting electrode 142 can be detected (refer to FIG. 1). In this manner, the MEMS device 100 as a gyro sensor can obtain the angular velocity ω about the Z-axis based on the amount of changes in the electrostatic capacitances between the movable detecting electrode 126 and the fixed detecting electrodes 140 and 142.

According to the first embodiment described above, the following advantageous effects can be obtained.

According to the MEMS device 100, the second structure 221 can straddle and cross the first structure 211 disposed in the groove portion 16 with the void 20 held between the second structure 221 and the first structure 211. By disposing the recess 17 in the groove portion 16 at the crossing portion 300, a spaced apart distance between the first structure 211 disposed in the groove portion 16 and the second structure 221 straddling and crossing the first structure 211 can be increased. By disposing the overpass portion 222 that is formed by narrowing the width of the second structure 221 straddling and crossing the first structure 211 at the crossing portion 300, the overlapping area of the first structure 211 and the second structure 221 can be reduced.

Due to this, in the MEMS device 100, the first wiring 30 and the second wiring 40 cross each other with the void 20 held therebetween, whereby the parasitic capacitance generated between the first structure 211 and the second structure 221 can be suppressed. By increasing the spaced apart distance between the first structure 211 and the second structure 221, the parasitic capacitance generated between the first wiring 30 and the second wiring 40 can be suppressed. By reducing the overlapping area of the first structure 211 and the second structure 221 at the crossing portion 300, the parasitic capacitance generated between the first structure 211 and the second structure 221 can be suppressed. Moreover, the first wiring 30 and the second wiring 40 can cross each other with a simple structure. Therefore, even in the MEMS device 100 having a complex wiring structure, a wiring layout is facilitated and thus the MEMS device 100 can be reduced in size.

Therefore, the parasitic capacitance generated between the wirings is suppressed, so that the MEMS device 100 in which electrical characteristics of the MEMS element 102 are less adversely affected and detection accuracy for angular velocity or the like is enhanced can be obtained.

Second Embodiment

Figure 9:
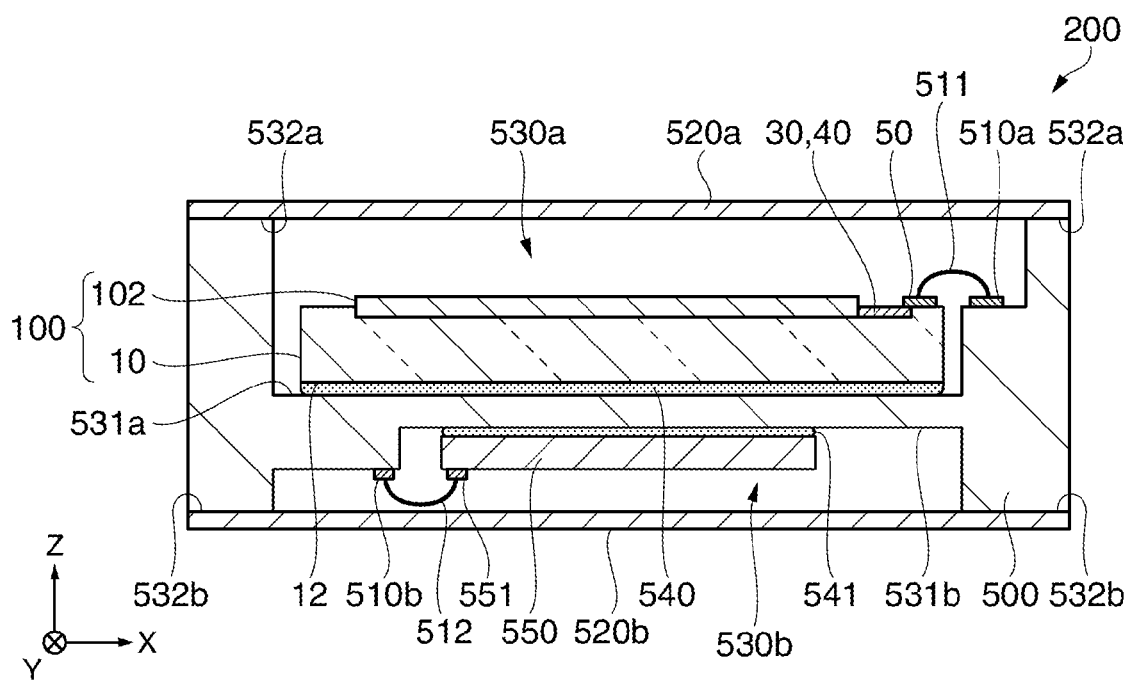
FIG. 9 schematically shows a schematic configuration of an electronic module according to a second embodiment.

FIG. 9 shows an electronic module according to a second embodiment.

FIG. 9 is a cross-sectional view showing a schematic configuration of the electronic module 200 as viewed cross-sectionally, showing the case where the MEMS device 100 described above is mounted (accommodated). The configuration of the mounted MEMS device 100 is similar to the first embodiment. Therefore, the electronic module 200 of the embodiment will be described with reference to FIG. 9 while similar configurations are denoted by similar reference numerals and signs and the description thereof is simplified or omitted.

The electronic module 200 includes the MEMS device 100 and a package 500 on which the MEMS device 100 is mounted. The package 500 has a recess 530a on which the MEMS device 100 is mounted and a recess 530b on which a driving circuit module 550 for driving the MEMS device 100 is mounted. The package 500 of the embodiment is formed of, for example, a material such as ceramics.

In the electronic module 200, the mounted MEMS device 100 is disposed on a bottom surface 531a of the recess 530a. The MEMS device 100 is connected (bonded) such that the second surface 12 of the base substrate 10 constituting the MEMS device 100 and the bottom surface 531a are connected (bonded) together using an adhesive 540 or the like. The driving circuit module 550, which is disposed in the recess 530b, is connected (bonded) with a bottom surface 531b of the recess 530b using an adhesive 541 or the like.

In FIG. 9, the driving circuit module 550 is mounted on a rear surface of the MEMS device 100 with the package 500 interposed therebetween. However, even a structure of directly bonding the driving circuit module 550 on the MEMS device 100 causes no problem.

In the package 500, a wiring electrode 510a is disposed for transmitting a signal of angular velocity or the like output from the MEMS device 100 to the outside of the package 500 or to the driving circuit module 550. The wiring electrode 510a is electrically connected, through a wiring 511, with the electrode pad 50 disposed on the base substrate 10 of the MEMS device 100. The wiring 511 of the embodiment electrically connects the electrode pad 50 with the wiring electrode 510a using a gold (Au) wire by, for example, a wire bonding method. The wire material of the wiring 511 is not limited to gold (Au). The wiring 511 may be electrically connected using aluminum (Al), copper (Cu), or the like by another wiring method. The connection of the electrode pad 50 and the wiring electrode 510a is not limited to a wire bonding method. Any connecting method may be used as long as the electrodes can be connected through the wiring 511. An electrode 551 disposed on the driving circuit module 550 and a wiring electrode 510b are electrically connected through a wiring 512 by, for example, a wire bonding method or the like, similarly to the wiring 511.

The electronic module 200 includes lids 520a and 520b. A top surface 532a of the recess 530a and the lid 520a are connected, while a top surface 532b of the recess 530b and the lid 520b are connected. For the material for forming the lids 520a and 520b, metal such as, for example, stainless steel, glass, or the like can be used.

Due to this, the electronic module 200 can detect angular velocity or the like with the MEMS device 100 mounted on the recess 530a, and output a signal according to the angular velocity or the like to the outside of the package 500.

According to the second embodiment described above, the following advantageous effects can be obtained.

According to the electronic module 200, since the first wiring 30 and the second wiring 40, both included in the MEMS device 100, cross each other with the void 20 therebetween, a parasitic capacitance generated between the wirings is suppressed. Moreover, the first wiring 30 and the second wiring 40 can cross each other with a simple structure, and a reduction in the size of the MEMS device 100 can be achieved. Therefore, it is possible to obtain the electronic module 200 in which the parasitic capacitance between the wirings is suppressed, electrical characteristics of the MEMS device 100 are less adversely affected, detection accuracy for angular velocity or the like is enhanced, and a reduction in size is achieved.

EXAMPLES

Next, examples to which the electronic module 200 having the MEMS device 100 according to the embodiment of the invention mounted thereon is applied will be described based on FIGS. 10 to 13.

Electronic Apparatuses

First, electronic apparatuses to which the electronic module 200 according to the second embodiment having the MEMS device 100 according to the first embodiment of the invention mounted thereon is applied will be described in detail based on FIGS. 10 to 12.

Figure 10:
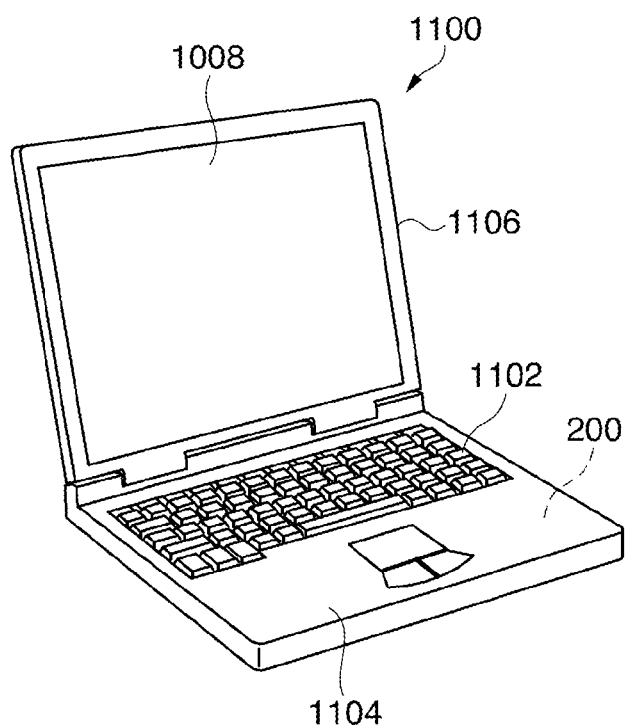
FIG. 10 is a schematic view showing an electronic apparatus according to an example.

FIG. 10 is a perspective view showing a schematic configuration of a mobile (or notebook) personal computer as an electronic apparatus including the electronic module according to the second embodiment of the invention. In the drawing, the personal computer 1100 includes a main body portion 1104 including a keyboard 1102 and a display unit 1106 having a display portion 1008. The display unit 1106 is foldably supported relative to the main body portion 1104 via a hinge structure portion. In the personal computer 1100, the electronic module 200 that functions as a gyro sensor or the like for detecting the tilt of the personal computer is incorporated. Due to a reduction in the size of the electronic module 200, the electronic module 200 can be incorporated even in a reduced thickness portion such as the display unit 1106.

Figure 11:
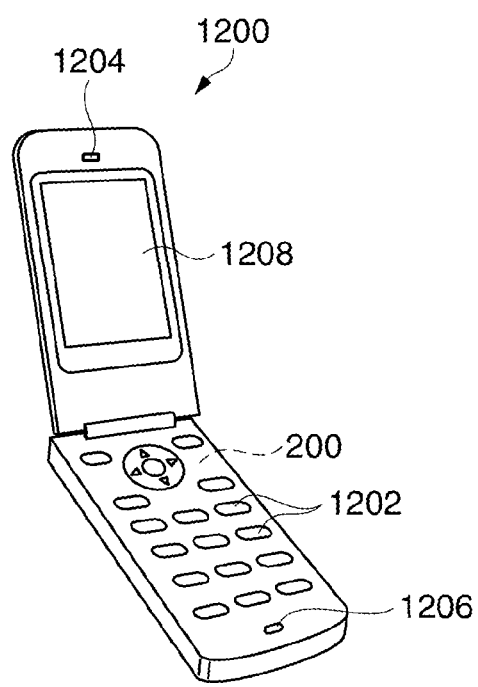
FIG. 11 is a schematic view showing an electronic apparatus according to an example.

FIG. 11 is a perspective view showing a schematic configuration of a mobile phone (including a PHS) as an electronic apparatus including the electronic module according to the second embodiment of the invention. In the drawing, the mobile phone 1200 includes a plurality of operation buttons 1202, an earpiece 1204, and a mouthpiece 1206. A display portion 1208 is arranged between the operation buttons 1202 and the earpiece 1204. In the mobile phone 1200, the electronic module 200 that functions as a gyro sensor or the like for detecting the tilt or moving direction of the mobile phone 1200 is incorporated. Due to a reduction in the size of the electronic module 200, the electronic module 200 can be easily incorporated even in the mobile phone 1200 for which a reduction in size is required.

Figure 12:
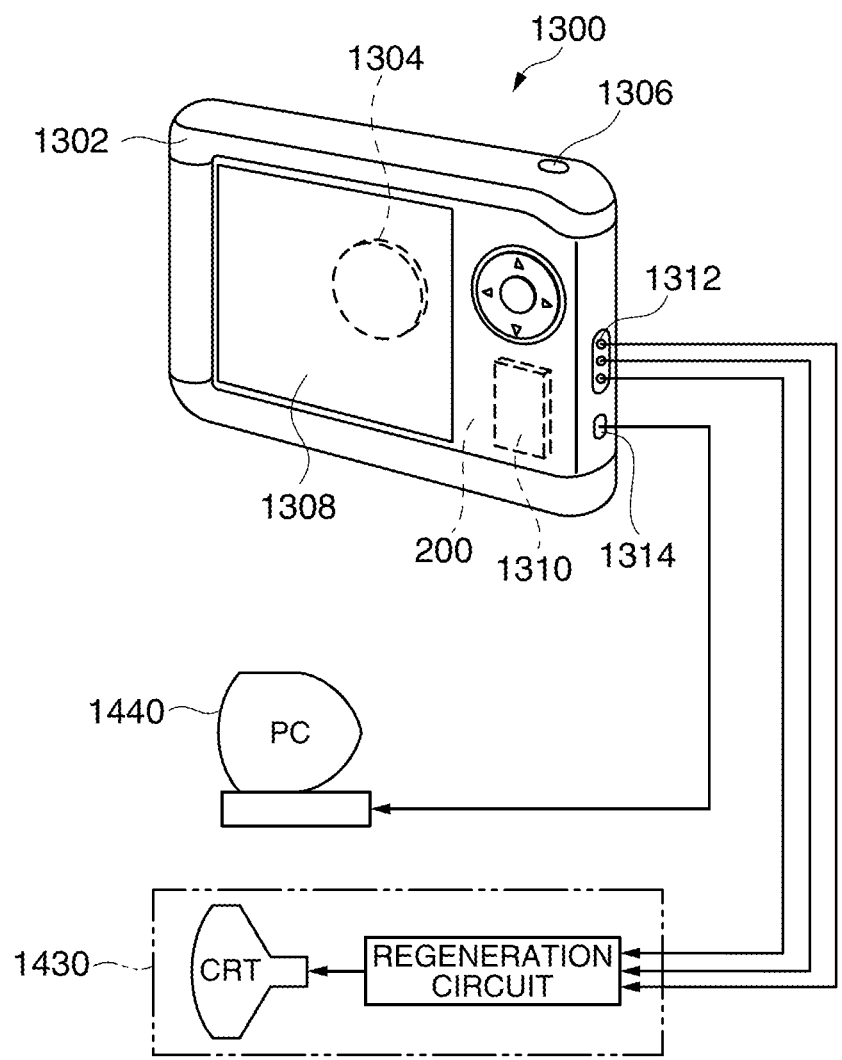
FIG. 12 is a schematic view showing an electronic apparatus according to an example.

FIG. 12 is a perspective view showing a schematic configuration of a digital still camera as an electronic apparatus including the electronic module according to the second embodiment of the invention. In the drawing, connections with external apparatuses are also shown in a simplified manner. Usual cameras expose a silver halide photographic film with an optical image of a subject, whereas the digital still camera 1300 photoelectrically converts an optical image of a subject with an imaging element such as a CCD (Charge Coupled Device) to generate imaging signals (image signals).

A display portion 1308 is disposed on the back surface of a case (body) 1302 in the digital still camera 1300 and configured to perform display based on imaging signals generated by a CCD. The display portion 1308 functions as a finder that displays a subject as an electronic image. Moreover, on the front side (the rear side in the drawing) of the case 1302, a light receiving unit 1304 including an optical lens (imaging optical system) and a CCD is disposed.

When a photographer confirms a subject image displayed on the display portion 1308 and presses down a shutter button 1306, imaging signals of a CCD at the time are transferred to and stored in a memory 1310. In the digital still camera 1300, a video signal output terminal 1312 and a data communication input/output terminal 1314 are disposed on the side surface of the case 1302. Then, as shown in the drawing, a television monitor 1430 and a personal computer 1440 are connected as necessary to the video signal output terminal 1312 and the data communication input/output terminal 1314, respectively. Further, the imaging signals stored in the memory 1310 are output to the television monitor 1430 or the personal computer 1440 by a predetermined operation. In the digital still camera 1300, the electronic module 200 that functions as a gyro sensor or the like for detecting the tilt of the digital still camera is incorporated. Due to a reduction in the size of the electronic module 200, the electronic module 200 can be easily incorporated even in the digital still camera 1300 for which a reduction in size is required.

The electronic module 200 according to the second embodiment of the invention can be applied to for example, in addition to the personal computer (mobile personal computer) in FIG. 10, the mobile phone in FIG. 11, and the digital still camera in FIG. 12, electronic apparatuses such as inkjet ejection apparatuses (for example, inkjet printers), laptop personal computers, television sets, video camcorders, video tape recorders, car navigation systems, pagers, electronic notebooks (including those with communication function), electronic dictionaries, calculators, electronic gaming machines, word processors, workstations, videophones, surveillance television monitors, electronic binoculars, POS terminals, medical equipment (for example, electronic thermometers, sphygmomanometers, blood glucose meters, electrocardiogram measuring systems, ultrasonic diagnosis apparatuses, and electronic endoscopes), fishfinders, various kinds of measuring instrument, indicators (for example, indicators used in vehicles, aircraft, and ships), and flight simulators.

Mobile Unit

Figure 13:
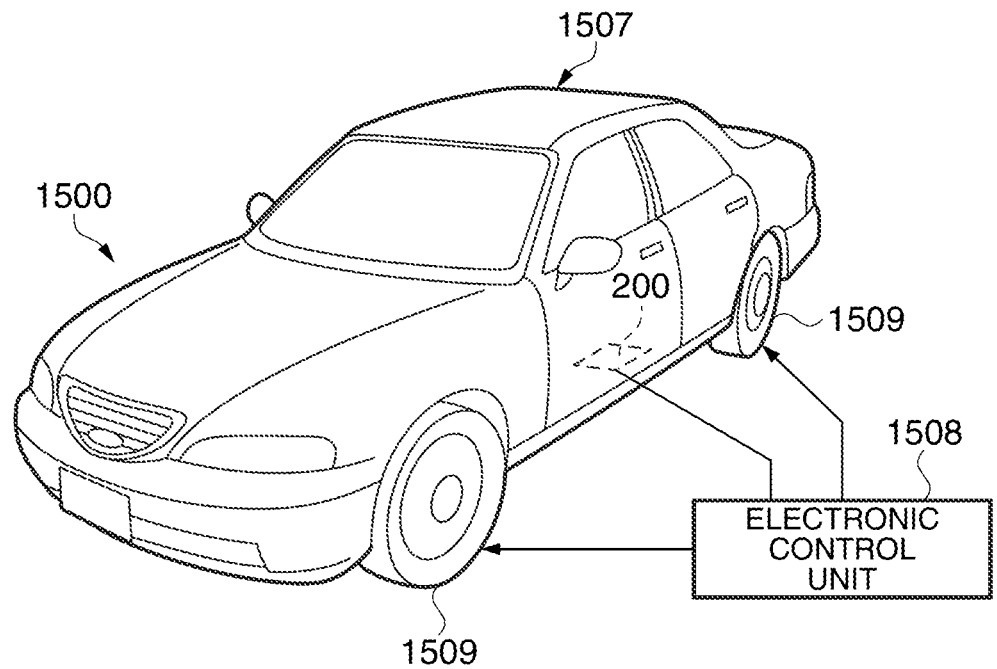
FIG. 13 is a schematic view showing a mobile unit according to an example.

FIG. 13 is a perspective view schematically showing an automobile as an exemplary mobile unit. To the automobile 1500, the electronic module 200 having the MEMS device 100 according to the embodiment of the invention mounted thereon is applied. For example, as shown in the drawing, an electronic control unit (ECU) 1508 that incorporates the electronic module 200 therein to control the tilt or the like of the automobile 1500 is mounted on an automobile body 1507 of the automobile 1500 as a mobile unit. The electronic module 200 whose size is reduced is used for a mobile unit such as the automobile 1500 on which a number of electronic control units 1508 are mounted, so that the size reduction and freedom degree of mounting position of the electronic control unit 1508 can be enhanced. In addition, the electronic module 200 can be widely applied to electronic control units for a car navigation system, an anti-lock brake system (ABS), an air bag, engine control, or the like.

The entire disclosure of Japanese Patent Application No. 2012-162382, filed Jul. 23, 2012 is expressly incorporated by reference herein.

What is claimed is:

1. A MEMS device comprising:
   a base substrate;
   a first wiring disposed on the base substrate using a first structure, wherein a groove portion is disposed on the base substrate, and the first structure is disposed in the groove portion;
   a second wiring disposed on the base substrate using the first structure and a second structure connected to the first structure; and
   a MEMS element connected with the first wiring and the second wiring and arranged on the base substrate, wherein
   the first wiring and the second wiring include a crossing portion where the first wiring and the second wiring cross each other, at the crossing portion, the first structure of the first wiring and the second structure of the second wiring cross each other, and the groove portion at the crossing portion is deeper than the groove portion at the other portions.

2. The MEMS device according to claim 1, wherein the width of the second structure at the crossing portion is narrower than that of the second structure at the other portions.

3. The MEMS device according to claim 1, wherein the first structure includes metal, and
the second structure includes silicon.

4. An electronic module comprising the MEMS device according to claim 1 mounted thereon.

5. An electronic apparatus comprising the MEMS device according to claim 1 mounted thereon.

6. A mobile unit comprising the MEMS device according to claim 1 mounted thereon.

7. A MEMS device comprising:
a base substrate;
a first wiring disposed on the base substrate using a first structure, wherein a groove portion is disposed on the base substrate, and the first structure is disposed in the groove portion;
a second wiring disposed on the base substrate using the first structure and a second structure connected to the first structure; and
a MEMS element connected with the first wiring and the second wiring and arranged on the base substrate, wherein
the first wiring and the second wiring include a crossing portion where the first wiring and the second wiring cross each other,
at the crossing portion, the first structure of the first wiring and the second structure of the second wiring cross each other, and
the second structure is not disposed in the groove portion at the crossing portion.

8. A MEMS device comprising; a base substrate; a first wiring disposed on the base substrate using a first structure; a second wiring disposed on the base substrate using a second structure; and
a MEMS element connected with the first wiring and the second wiring and arranged on the base substrate, wherein
the first wiring and the second wiring include a crossing portion where the first wiring and the second wiring cross each other, and
at the crossing portion, the first structure of the first wiring and the second structure of the second wiring cross each other, wherein
a groove portion is disposed on the base substrate, and the first structure is disposed in the groove portion and the second structure is not disposed in the groove portion at least at the crossing portion.

9. The MEMS device according to claim 8, wherein the groove portion at the crossing portion is deeper than the groove portion at the other portions.

10. The MEMS device according to claim 8, wherein the width of the second structure at the crossing portion is narrower than that of the second structure at the other portions.

11. The MEMS device according to claim 8, wherein the first structure includes metal, and
the second structure includes silicon.

12. An electronic module comprising the MEMS device according to claim 8 mounted thereon.

13. An electronic apparatus comprising the MEMS device according to claim 8 mounted thereon.

14. A mobile unit comprising the MEMS device according to claim 8 mounted thereon.

* * * * *